(12) United States Patent
Fukusako et al.

(10) Patent No.: US 7,696,614 B2
(45) Date of Patent: Apr. 13, 2010

(54) DRIVER MODULE STRUCTURE

(75) Inventors: Hiroyuki Fukusako, Kagoshima (JP); Kazunori Seno, Kagoshima (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 12/335,057

(22) Filed: Dec. 15, 2008

(65) Prior Publication Data
US 2009/0097209 A1    Apr. 16, 2009

Related U.S. Application Data

(63) Continuation of application No. 10/598,903, filed as application No. PCT/JP2005/004349 on Mar. 11, 2005, now Pat. No. 7,582,959.

(30) Foreign Application Priority Data
Mar. 16, 2004  (JP) .............................. 2004-074285

(51) Int. Cl.
*H05K 7/20* (2006.01)

(52) U.S. Cl. ................ 257/678; 257/E23.065; 257/E23.079; 257/E23.105; 257/774; 257/680; 257/712; 257/713; 257/720; 257/668; 257/E23.114; 349/150; 361/719

(58) Field of Classification Search .............. 257/678, 257/E23.065, E23.079, E25.105, 774, 680, 257/712, 713, 720, 668, E23.114; 349/150; 361/719
See application file for complete search history.

(56) References Cited

U.S. PATENT DOCUMENTS

| | | | |
|---|---|---|---|
| 5,721,602 A | 2/1998 | Narayan et al. | |
| 6,304,450 B1 | 10/2001 | Dibene et al. | |
| 6,845,014 B2 | 1/2005 | Wakabayashi et al. | |
| 7,342,796 B2 | 3/2008 | Aukzemas | |
| 7,344,345 B2 | 3/2008 | Aukzemas | |
| 2001/0014029 A1 | 8/2001 | Suzuki et al. | |
| 2004/0156175 A1 | 8/2004 | Nakamura et al. | |
| 2006/0006405 A1 | 1/2006 | Mazzchette | |
| 2006/0198106 A1 | 9/2006 | You | |
| 2007/0182877 A1* | 8/2007 | Tanokuchi et al. | 349/58 |
| 2007/0278669 A1 | 12/2007 | Hierhlzer et al. | |
| 2008/0037223 A1 | 2/2008 | Muller et al. | |
| 2008/0101032 A1 | 5/2008 | Tschirbs et al. | |

FOREIGN PATENT DOCUMENTS

| | | |
|---|---|---|
| JP | 57-99762 | 6/1982 |
| JP | 9-102688 | 4/1997 |
| JP | 11-284113 | 10/1999 |
| JP | 2000-91884 | 3/2000 |
| JP | 2000-299416 | 10/2000 |
| JP | 2001-326879 | 11/2001 |
| JP | 2003-220722 | 8/2003 |

\* cited by examiner

*Primary Examiner*—Alexander O Williams
(74) *Attorney, Agent, or Firm*—Hamre, Schumann, Mueller & Larson, P.C.

(57) ABSTRACT

A driver module structure includes a flexible circuit board (2) provided with a wiring pattern (7), a semiconductor device mounted on the flexible circuit board (2), and an electrically conductive heat-radiating member (4) joined to the semiconductor device. The wiring pattern (7) includes a ground wiring pattern (8). The flexible circuit board (2) has a cavity (9) that exposes a portion of the ground wiring pattern (8). The exposed portion of the ground wiring pattern (8) and the heat-radiating member (4) are connected to establish electrical continuity via a member (11) that is fitted into the cavity (9).

9 Claims, 4 Drawing Sheets

DRIVER MODULE STRUCTURE

CROSS-REFERENCE TO RELATED APPLICATIONS

This application is a Continuation of application Ser. No. 10/598,903, filed Sep. 14, 2006, now U.S. Pat. No. 7,582,959 issued on Sep. 1, 2009, which is a U.S. National Stage of PCT/JP2005/004349, filed Mar. 11, 2005, which applications are incorporated herein by reference.

TECHNICAL FIELD

The present invention relates to a driver module structure of a TCP (tape carrier package) used for a flat display or the like.

BACKGROUND ART

FIG. 9 is a perspective view of an example of a conventional driver module structure and shows the main part of the driver module structure. The driver module structure of FIG. 9 is an example in which a large amount of heat is generated from a semiconductor device that controls a flat display or the like (see, e.g., Patent Document 1).

In FIG. 9, a driver module 30 includes a flexible circuit board 31 provided with a wiring pattern, semiconductor devices 32 connected to the flexible circuit board 31, and a heat-radiating member 34. In this configuration, the heat-radiating member 34 is joined to the back (upper portion) of each of the semiconductor devices 32. Thus, the heat generated from the semiconductor devices 32 is radiated into the surroundings via the heat-radiating member 34, and the semiconductor devices 32 are cooled.

For the conventional driver module structure of FIG. 9, the heat-radiating member 34 may be connected to a ground to suppress the effect of electromagnetic interference (EMI) on the semiconductor devices 32. In such a case, one end of a ground wire is connected to the heat-radiating member 34 with screws or the like and the other end is connected to a case that is a ground of an apparatus incorporating the driver module or a ground of the substrate, so that the heat-radiating member 34 can be shielded.

However, when the ground wire is used to connect the heat-radiating member 34 and the ground, the length of the ground wire becomes long. This increases the impedance for higher harmonics and reduces the effect of suppressing the EMI. Moreover, the ground wire itself may act as an antenna and generate harmonics.

Patent Document 1: JP 2000-299416 A

DISCLOSURE OF INVENTION

The present invention solves the above conventional problems and has an object of providing a driver module structure that can improve the EMI suppression effect with a simple structure while maintaining the heat radiation effect of a heat-radiating member.

To achieve the object, a driver module structure of the present invention includes a flexible circuit board provided with a wiring pattern, a semiconductor device mounted on the flexible circuit board, and an electrically conductive heat-radiating member joined to the semiconductor device. The wiring pattern includes a ground wiring pattern. The flexible circuit board has a cavity that exposes a portion of the ground wiring pattern. The exposed portion of the ground wiring pattern and the heat-radiating member are connected to establish electrical continuity via a member that is fitted into the cavity.

BEST MODE FOR CARRYING OUT THE INVENTION

The present invention can achieve a driver module structure that improves the shielding effect with a simple structure while maintaining the heat radiation effect.

In the driver module structure of the present invention, it is preferable that the cavity is a recess for exposing a portion of the ground wiring pattern to the heat-radiating member, and the member fitted into the cavity is a projection of the heat-radiating member. This configuration can connect the heat-radiating member to the ground at the shortest distance.

It is preferable that the exposed portion of the ground wiring pattern and the projection are connected via an electrically conductive bonding material. This configuration can improve both the bond strength and electrical conductivity.

It is preferable that the cavity is a through hole penetrating the ground wiring pattern, a portion of the ground wiring pattern on the opposite side from the heat-radiating member is exposed, and the member fitted into the cavity is a projection of the heat-radiating member. This configuration can connect the heat-radiating member to the ground at the short distance and further relax the required accuracy of the height of the projection.

It is preferable that the projection is hollow, and the end of the projection is deformed so that the exposed portion of the ground wiring pattern and the projection are connected to establish electrical continuity. This configuration can improve the bond strength by the heat-radiating member itself without using any other dedicated fastening means.

It is preferable that the exposed portion of the ground wiring pattern and the projection are connected via an electrically conductive bonding material. This configuration can improve both the bond strength and electrical conductivity.

It is preferable that the cavity is a through hole penetrating the ground wiring pattern, a portion of the ground wiring pattern on the opposite side from the heat-radiating member is exposed, and the member fitted into the cavity is a fastener for fastening the flexible circuit board and the heat-radiating member. This configuration can connect the heat-radiating member to the ground at a short distance and improve the bond strength.

It is preferable that the exposed portion of the ground wiring pattern and the fastener are connected via an electrically conductive bonding material. This configuration can improve both the bond strength and electrical conductivity.

Hereinafter, embodiments of the present invention will be described with reference to the drawings.

Embodiment 1

Figure 1:
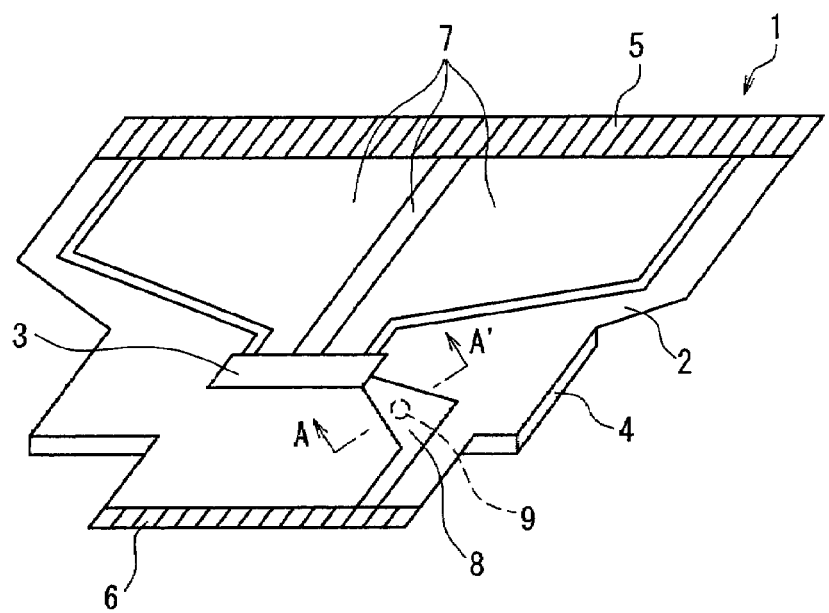
FIG. 1 is a perspective view of a driver module structure in Embodiment 1 of the present invention.
Figure 2:
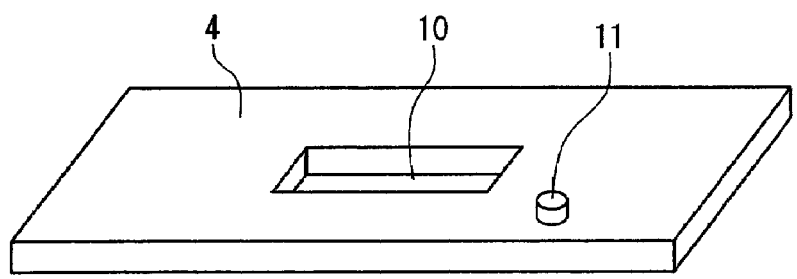
FIG. 2 is a perspective view of a heat-radiating member of the driver module structure in Embodiment 1 of the present invention.
Figure 3:
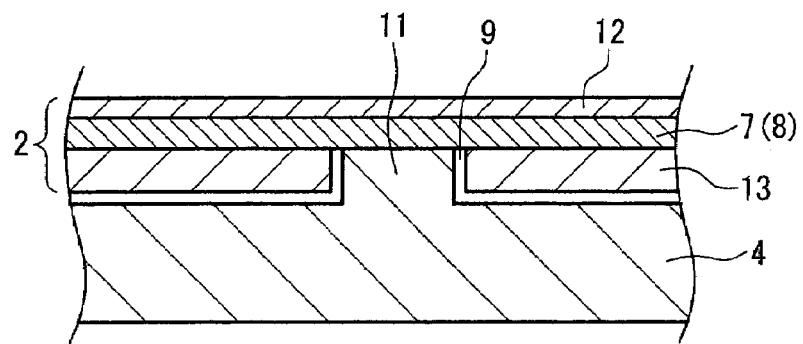
FIG. 3 is a cross-sectional view showing a main part of the driver module structure in Embodiment 1 of the present invention.

A driver module structure of Embodiment 1 of the present invention will be described by referring to FIGS. 1 to 3. Embodiment 1 is an example of a liquid crystal driver, which also is applied to the following embodiments. FIG. 1 is a perspective view of the driver module structure of Embodiment 1. FIG. 2 is a perspective view of a heat-radiating member of the driver module structure of Embodiment 1. FIG. 3 is a cross-sectional view taken along the line AA' in FIG. 1 and shows a state in which a recess of a flexible circuit board and a projection of the heat-radiating member are fitted together.

As shown in FIG. 1, a driver module 1 includes a flexible circuit board 2, a semiconductor device 3 mounted on the flexible circuit board 2, and a heat-radiating member 4 joined to the flexible circuit board 2 and the semiconductor device 3. The flexible circuit board 2 is made of a flexible plastic film. An electrode 5 connected to a liquid crystal panel is formed at one end of the flexible circuit board 2, and an electrode 6 connected to a control substrate (not shown) is formed at the other end. The electrodes 5, 6 and the semiconductor device 3 are connected by a wiring pattern 7.

The electrode 5 of the flexible circuit board 2 is connected to a transparent electrode formed on the liquid crystal panel via an anisotropic conductive film (ACF) or anisotropic conductive paste (ACP). The electrode 6 of the flexible circuit board 2 is connected to an electrode formed on the control substrate by soldering or the like. The wiring pattern 7 of the flexible circuit board 2 includes a ground line 8 as a reference potential of the semiconductor device 3, a power line (not shown) for applying a voltage, and various types of signal lines (not shown).

The semiconductor device 3 is an IC that performs display control of the liquid crystal panel. The semiconductor device 3 is connected to the wiring pattern 7 of the flexible circuit board 2 by metal bonding and is sealed with resin.

As shown in FIG. 2, the heat-radiating member 4 is substantially rectangular in shape when viewed from above. There is an accommodating portion 10 in the center of the heat-radiating member 4 for accommodating the semiconductor device 3. The heat-radiating member 4 is attached to the semiconductor device 3 and the flexible circuit board 2 with a heat radiation agent that is applied to the inner sides of the accommodating portion 10 and the surface that comes into contact with the flexible circuit board 2. For attachment, the heat-radiating member 4 either may be fixed completely by bonding or provided movably via grease or the like. A projection 11 is fitted into a recess 9 formed in the flexible circuit board 2, which will be described in detail later by referring to FIG. 3.

The heat-radiating member 4 preferably is made of a material whose thermal conductivity is as high as possible to improve the heat radiation effect. Moreover, the heat-radiating member 4 should have electrical conductivity for connection to the ground line 8. For example, Al is suitable for the material of the heat-radiating member 4 because it meets those requirements and also is lightweight.

Next, the state in which the recess 9 of the flexible circuit board 2 and the projection 11 of the heat-radiating member 4 are fitted together will be described in detail by referring to FIG. 3. As shown in FIG. 3, the flexible circuit board 2 is formed by sandwiching the wiring pattern 7 (ground line 8) between an upper cover 12 and a lower cover 13.

The upper cover 12 has a thickness of, e.g., 15 μm. The lower cover 13 has a thickness of, e.g., 75 μm. The wiring pattern 7 is made of Cu with a thickness of, e.g., 25 μm. In such a three-layer structure, a cavity is formed in part of the lower cover 13 (bottom layer) so as to expose the ground line 8 of the wiring pattern 7 (intermediate layer). That is, when the flexible circuit board 2 is seen as the whole of three layers, the cavity of the lower cover 13 corresponds to the recess 9.

In the example of FIGS. 2 and 3, the projection 11 is cylindrical in shape. The diameter of the projection 11 is smaller than that of the recess 9 so that the projection 11 is fitted into the recess 9. By fitting the projection 11 into the recess 9, the heat-radiating member 4 functions as a shield for the semiconductor device 3. This configuration can connect the heat-radiating member 4 to the ground line 8 at the shortest distance and thus improve the EMI suppression effect with a simple structure.

Although the projection 11 is in the form of a cylinder in this embodiment, it may be a rectangular parallelepiped. Alternatively, the projection 11 may have different horizontal sections in each part. However, a cylindrical shape is desirable, since the projection 11 can be fitted easily during manufacture.

When the recess 9 of the flexible circuit board 2 and the projection 11 of the heat-radiating member 4 are fitted together, an electrically conductive thermosetting bonding material such as ACF or ACP may be provided between the recess 9 and the projection 11, thereby further improving both the bond strength and electrical conductivity. The bonding material is not limited to ACF or ACP, and any material can be used as long as it has electrical conductivity and joins the projection 11 to the recess 9 in which the ground line 8 is exposed. For example, the bonding material may be solder.

It is desirable that the height of the projection 11 of the heat-radiating member 4 is approximately the same as the thickness of the lower cover 13. However, even if the height of the projection 11 is about several μm smaller than the thickness of the lower cover 13, the heat-radiating member 4 can be connected to the ground line 8 when ACF or ACP is used to fit the recess 9 and the projection 11 together. This is because the bonding material (ACF or ACP) present between the projection 11 and the exposed portion of the ground line 8 is cured to join them.

Moreover, even if the height of the projection 11 is about several μm larger than the thickness of the lower cover 13, the heat-radiating member 4 can be connected to the flexible circuit board 2. This is because the flexible circuit board 2 is made of a flexible plastic film, and excess height of the projection 11 is absorbed by deformation of the upper cover 12. Accordingly, strict accuracy is not required for the height of the projection 11, and the projection 11 can be processed easily.

Embodiment 2

Figure 4:
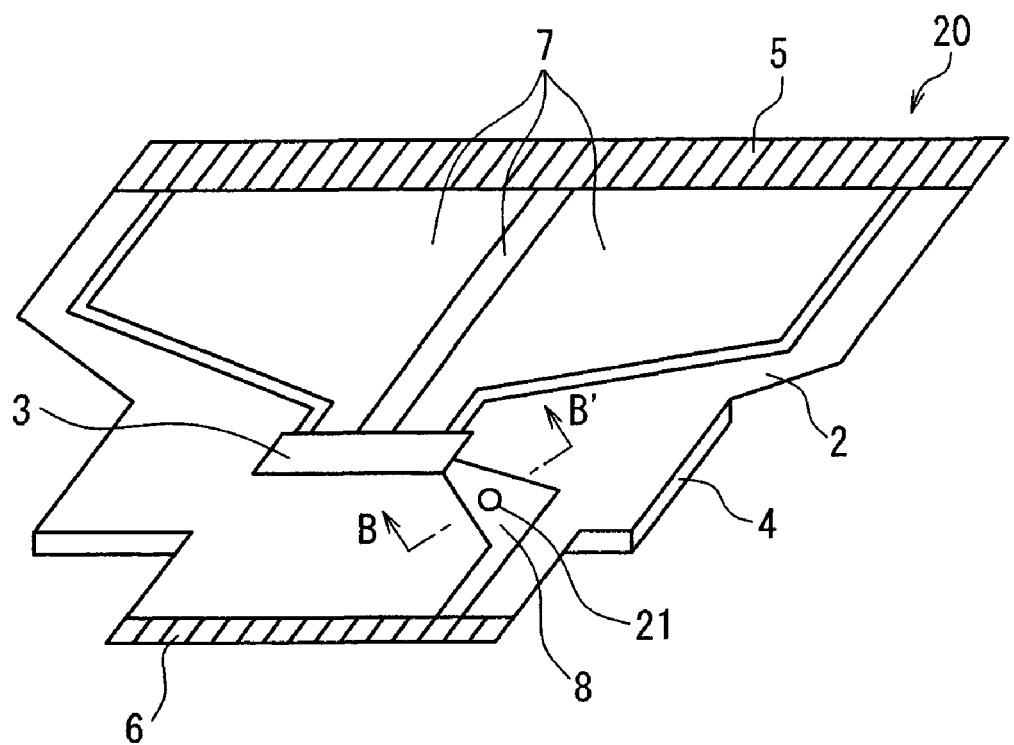
FIG. 4 is a perspective view of a driver module structure in Embodiment 2 of the present invention.
Figure 5:
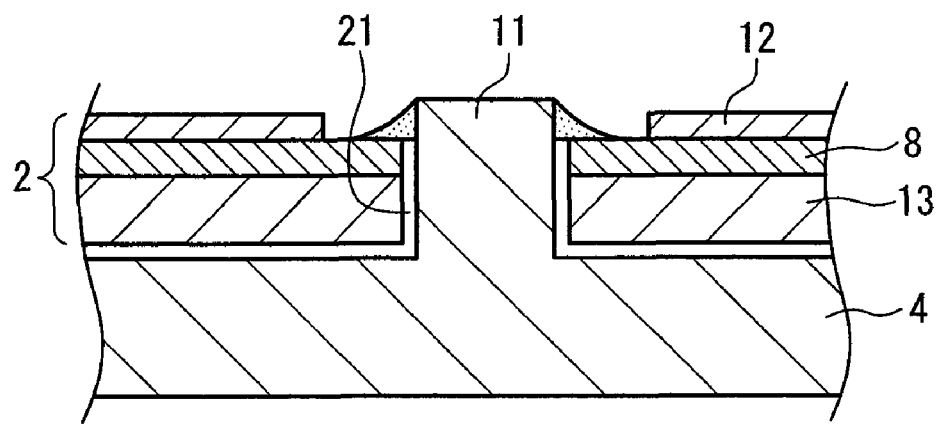
FIG. 5 is a cross-sectional view showing a main part of the driver module structure in Embodiment 2 of the present invention.

A driver module structure of Embodiment 2 of the present invention will be described by referring to FIGS. 4 and 5. In FIGS. 4 and 5, the same components as those in FIGS. 1 to 3 are denoted by the same reference numerals, and the explanation will not be repeated.

FIG. 4 is a perspective view of the driver module structure of Embodiment 2. As shown in FIG. 4, a driver module 20 includes the flexible circuit board 2, and a through hole 21 penetrating the ground line 8 of the wiring pattern 7 is formed in the flexible circuit board 2.

FIG. 5 is a cross-sectional view taken along the line BB' in FIG. 4 and shows details in the vicinity of the through hole 21. The through hole 21 penetrates the upper cover 12, the lower cover 13, and the ground line 8. The diameter of the through hole 21 at the lower cover 13 and the ground line 8 is large enough to fit the projection 11 of the heat-radiating member 4. Moreover, the diameter of the through hole 21 at the upper cover 12 is larger than that at the lower cover 13 and the ground line 8. Therefore, a portion of the ground line 8 on the same side as the upper cover 12 is exposed.

In this configuration, the projection 11 and the through hole 21 are fitted while the projection 11 is inserted through the through hole 21. The end of the projection 11 is connected to the exposed portion of the ground line 8 via a bonding material such as ACF or ACP.

It is desirable that the height of the projection 11 is larger than the sum of the thicknesses of the upper cover 12, the lower cover 13, and the ground line 8. However, the accuracy of the height of the projection 11 is not defined strictly, and if the height of the projection 11 is at least the same as the thickness of the lower cover 13, then the heat-radiating member 4 and the ground line 8 can be connected via ACF or ACP.

In this embodiment, the cavity that connects the projection 11 and the ground line 8 is not a recess but a through hole. Thus, the accuracy of the height of the projection 11 becomes less strict compared to Embodiment 1.

Embodiment 3

Figure 6:
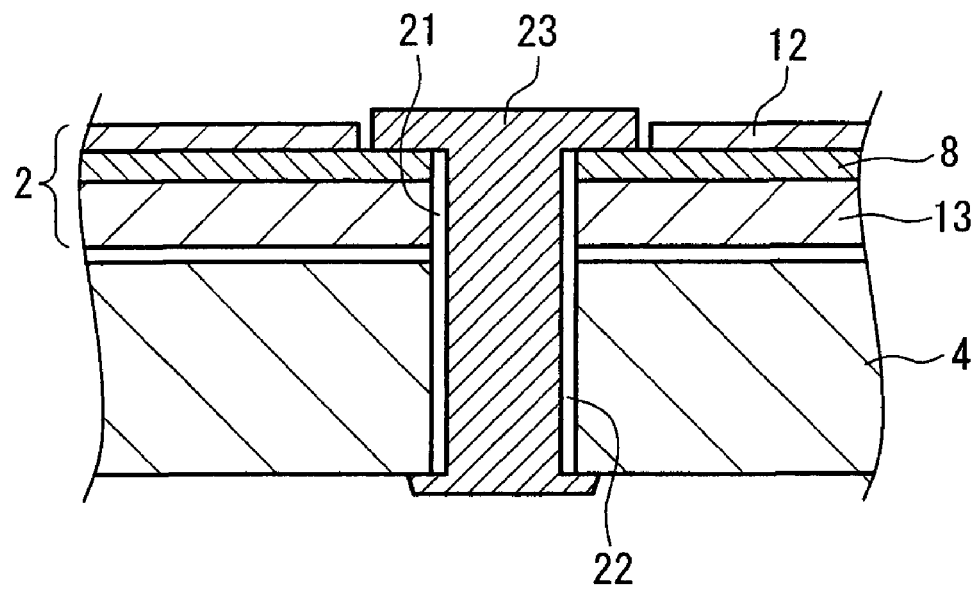
FIG. 6 is a cross-sectional view showing a main part of a driver module structure in Embodiment 3 of the present invention.

A driver module structure of Embodiment 3 of the present invention will be described by referring to FIG. 6. In FIG. 6, the same components as those in FIG. 5 are denoted by the same reference numerals, and the explanation will not be repeated. A perspective view of the driver module structure in Embodiment 3 is the same as FIG. 4 in Embodiment 2. FIG. 6 is a cross-sectional view taken along the line BB' in FIG. 4 and shows the main part of the driver module structure in this embodiment.

As shown in FIG. 6, the through hole 21 is formed in the flexible circuit board 2, and a through hole 22 is formed in the heat-radiating member 4 at the position that is to be aligned with the through hole 21. A rivet (fastening means) 23 is inserted through these through holes 21, 22. The rivet 23 connects the flexible circuit board 2 and the heat-radiating member 4.

The rivet 23 has electrical conductivity and comes into contact with the exposed portion of the ground line 8 and the heat-radiating member 4, thereby establishing electrical continuity between the ground line 8 and the heat-radiating member 4. It is desirable that an electrically conductive bonding material such as ACF, ACP, or solder is provided on the contact surfaces of the rivet 23 with the exposed portion of the ground line 8 and the heat-radiating member 4.

Embodiment 4

Figure 7:
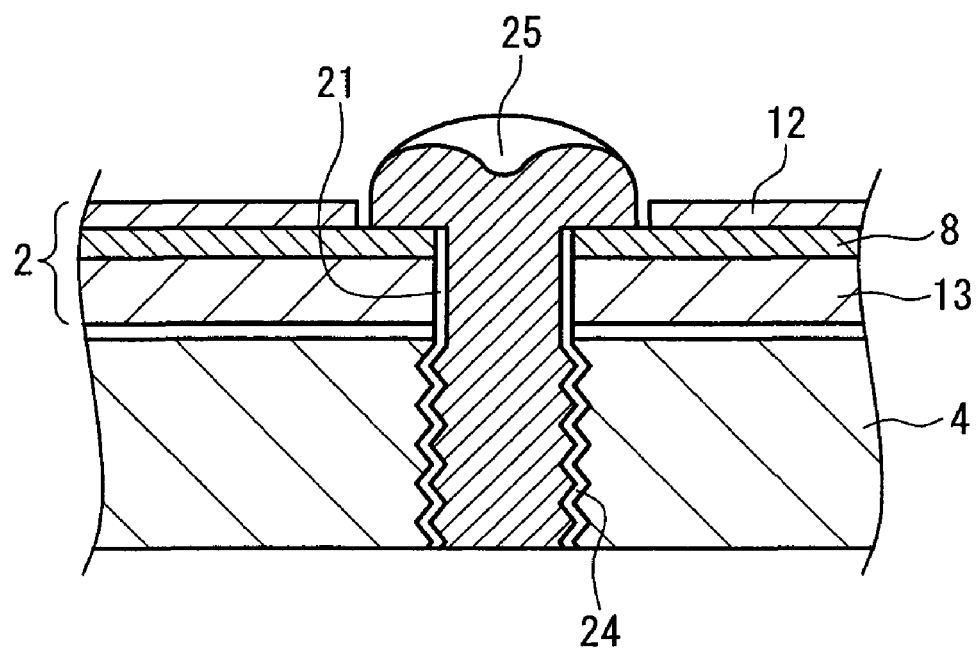
FIG. 7 is a cross-sectional view showing a main part of a driver module structure in Embodiment 4 of the present invention.

A driver module structure of Embodiment 4 of the present invention will be described by referring to FIG. 7. In FIG. 7, the same components as those in FIG. 6 are denoted by the same reference numerals, and the explanation will not be repeated. A perspective view of the driver module structure in Embodiment 4 is the same as FIG. 4 in Embodiment 2. FIG. 7 is a cross-sectional view taken along the line BB' in FIG. 4 and shows the main part of the driver module structure in this embodiment.

As shown in FIG. 7, the through hole 21 is formed in the flexible circuit board 2, and a through hole 24 is formed in the heat-radiating member 4 at the position that is to be aligned with the through hole 21. A screw (fastening means) 25 is threadedly fitted to the through hole 24 via the through hole 21. The screw 25 fastens and connects the flexible circuit board 2 and the heat-radiating member 4.

The screw 25 has electrical conductivity and comes into contact with the exposed portion of the ground line 8 and the heat-radiating member 4, thereby establishing electrical continuity between the ground line 8 and the heat-radiating member 4. It is desirable that an electrically conductive bonding material such as ACF, ACP, or solder is provided on the contact surfaces of the screw 25 with the exposed portion of the ground line 8 and the heat-radiating member 4.

The through hole 24 as shown in FIG. 7 is not limited to a through hole and may be a closed cavity.

Although the configurations of Embodiments 3 and 4 require a fastener in addition to the heat-radiating member 4, they are more advantageous in bond strength than the configurations of Embodiments 1 and 2.

Embodiment 5

Figure 8:
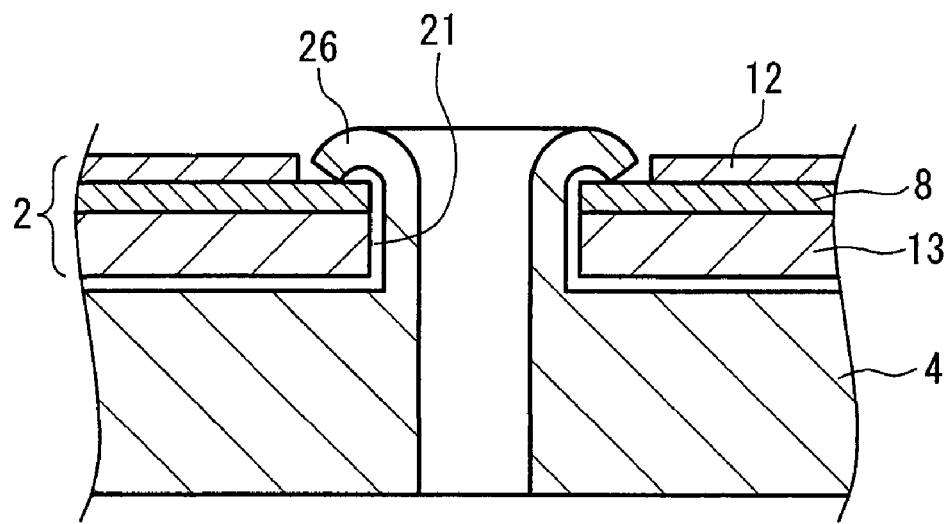
FIG. 8 is a cross-sectional view showing a main part of a driver module structure in Embodiment 5 of the present invention.
Figure 9:
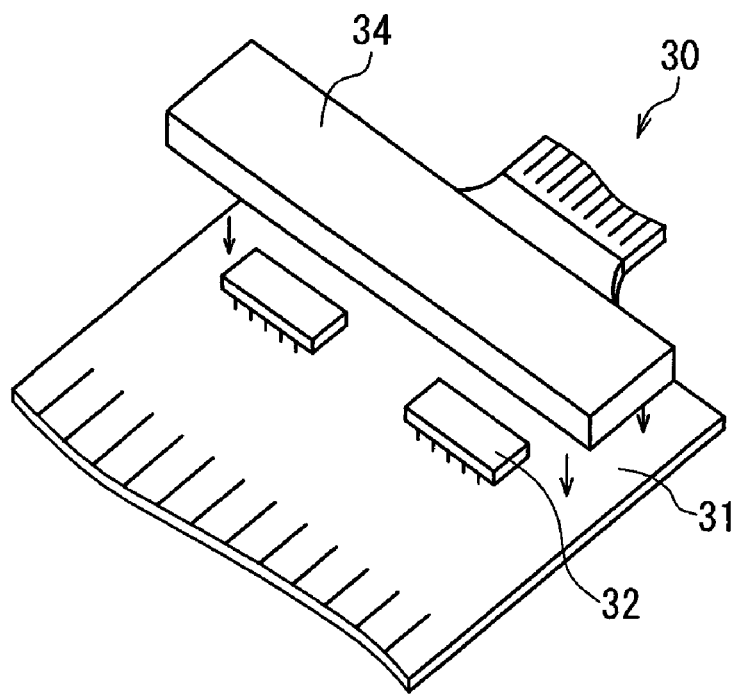
FIG. 9 is a perspective view of an example of a conventional driver module structure.

A driver module structure of Embodiment 5 of the present invention will be described by referring to FIG. 8. In FIG. 8, the same components as those in FIG. 5 are denoted by the same reference numerals, and the explanation will not be repeated. A perspective view of the driver module structure in Embodiment 5 is the same as FIG. 4 in Embodiment 2. FIG. 8 is a cross-sectional view taken along the line BB' in FIG. 4 and shows the main part of the driver module structure in this embodiment.

As shown in FIG. 8, the heat-radiating member 4 has a hollow projection 26. The projection 26 and the through hole 21 are fitted while the projection 26 is inserted through the through hole 21. Since the projection 26 is hollow, the end of the projection 26 can be deformed easily by applying pressure. In FIG. 8, the end of the projection 26 is extended in the radial direction, bent downward, and comes into contact with the exposed portion of the ground line 8.

This embodiment can ensure that the heat-radiating member 4 is connected by itself to the flexible circuit board 2 without using any other dedicated fastening means. The end of the projection 26 may be connected to the exposed portion of the ground line 8 via a bonding material such as ACF or ACP.

Each of the embodiments has been described above. The distance of connecting the heat-radiating member 4 and the ground line 8 is slightly longer in the configurations of Embodiments 2 to 5 than in the configuration of Embodiment 1. However, there is no difference among the embodiments in terms of making the connection at the shortest possible distance with a simple structure. Thus, all the configurations can not only improve the EMI suppression effect with a simple structure, but also exhibit an excellent shielding effect while maintaining the heat radiation effect of the heat-radiating member.

INDUSTRIAL APPLICABILITY

The present invention can improve the shielding effect while maintaining the heat radiation effect of a heat-radiating member, and therefore is suitable for a driver module of a TCP used for a flat display or the like.

The invention claimed is:

1. A driver module structure comprising:
a flexible circuit board provided with a wiring pattern;
a semiconductor device mounted on the flexible circuit board; and
an electrically conductive heat-radiating member joined to the semiconductor device,
wherein the wiring pattern comprises a ground wiring pattern,
the flexible circuit board has a cavity that exposes a portion of the ground wiring pattern,
the exposed portion of the ground wiring pattern and the heat-radiating member are connected to establish electrical continuity via a member that is fitted into the cavity,
an open portion in which the semiconductor device is not covered with the flexible circuit board is provided at a position where the semiconductor device is located,
the open portion is an opening formed in the flexible circuit board,
an accommodating portion for accommodating the semiconductor device is provided in the heat-radiating member at a position corresponding to the open portion, and
the heat-radiating member is attached to the semiconductor device with a heat radiation agent.

2. The driver module structure according to claim 1, wherein the cavity is a recess for exposing a portion of the ground wiring pattern to the heat-radiating member, and the member fitted into the cavity is a projection of the heat-radiating member.

3. The driver module structure according to claim 2, wherein the exposed portion of the ground wiring pattern and the projection are connected via an electrically conductive bonding material.

4. The driver module structure according to claim 1, wherein the cavity is a through hole penetrating the ground wiring pattern, a portion of the ground wiring pattern on an opposite side from the heat-radiating member is exposed, and the member fitted into the cavity is a projection of the heat-radiating member.

5. The driver module structure according to claim 4, wherein the projection is hollow, and an end of the projection is deformed so that the exposed portion of the ground wiring pattern and the projection are connected to establish electrical continuity.

6. The driver module structure according to claim 4, wherein the exposed portion of the ground wiring pattern and the projection are connected via an electrically conductive bonding material.

7. The driver module structure according to claim 1, wherein the cavity is a through hole penetrating the ground wiring pattern, a portion of the ground wiring pattern on an opposite side from the heat-radiating member is exposed, and the member fitted into the cavity is a fastener for fastening the flexible circuit board and the heat-radiating member.

8. The driver module structure according to claim 7, wherein the exposed portion of the ground wiring pattern and the fastener are connected via an electrically conductive bonding material.

9. The driver module structure according to claim 1, wherein the heat radiation agent is applied to inner sides of the accommodating portion.

* * * * *